United States Patent
Luo et al.

(10) Patent No.: US 7,767,588 B2
(45) Date of Patent: Aug. 3, 2010

(54) METHOD FOR FORMING A DEPOSITED OXIDE LAYER

(75) Inventors: Tien Ying Luo, Austin, TX (US); Rajesh A. Rao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 830 days.

(21) Appl. No.: 11/364,128

(22) Filed: Feb. 28, 2006

(65) Prior Publication Data
US 2007/0202708 A1 Aug. 30, 2007

(51) Int. Cl.
H01L 21/31 (2006.01)
H01L 21/461 (2006.01)
(52) U.S. Cl. .................. 438/758; 438/770; 257/E21.21
(58) Field of Classification Search .................. 438/758; 257/E21.21
See application file for complete search history.

(56) References Cited

U.S. PATENT DOCUMENTS

| | | | |
|---|---|---|---|
| 6,297,095 B1 * | 10/2001 | Muralidhar et al. | 438/257 |
| 6,320,784 B1 | 11/2001 | Muralidhar | |
| 6,344,403 B1 * | 2/2002 | Madhukar et al. | 438/503 |
| 6,413,819 B1 * | 7/2002 | Zafar et al. | 438/257 |
| 6,444,545 B1 * | 9/2002 | Sadd et al. | 438/503 |
| 6,617,639 B1 * | 9/2003 | Wang et al. | 257/324 |
| 6,713,127 B2 | 3/2004 | Subramony | |
| 7,157,334 B2 * | 1/2007 | Joo | 438/260 |
| 2002/0197823 A1 * | 12/2002 | Yoo et al. | 438/424 |
| 2003/0006451 A1 * | 1/2003 | Chang | 257/324 |
| 2003/0124873 A1 * | 7/2003 | Xing et al. | 438/770 |
| 2003/0183869 A1 * | 10/2003 | Crivelli et al. | 257/314 |
| 2005/0003679 A1 * | 1/2005 | Hyun et al. | 438/770 |
| 2005/0067651 A1 * | 3/2005 | Kim et al. | 257/314 |
| 2005/0153513 A1 * | 7/2005 | Lee et al. | 438/287 |
| 2005/0266637 A1 * | 12/2005 | Wang | 438/257 |
| 2006/0011969 A1 * | 1/2006 | Weimer et al. | 257/315 |
| 2006/0017092 A1 * | 1/2006 | Dong et al. | 257/314 |
| 2006/0166452 A1 | 7/2006 | Rao et al. | |

OTHER PUBLICATIONS

Lai; "Tunnel Oxide and ETOX™Flash Scaling Limitation"; IEEE 1998 Int'l Nonvolatile Memory Technology Conference; pp. 6-7.
Cavins et al.; "A Nitride-Oxide Blocking Layer for Scaled SONOS Non-Volatile Memory"; Motorola, Inc.; Jan. 10, 2002; 3 pages.

(Continued)

Primary Examiner—Kiesha R Bryant
Assistant Examiner—Igwe U Anya
(74) Attorney, Agent, or Firm—Zagorin O'Brien Graham LLP

(57) ABSTRACT

An insulating layer formed by deposition is annealed in the presence of radical oxygen to reduce bond defects. A substrate is provided. An oxide layer is deposited overlying the substrate. The oxide layer has a plurality of bond defects. The oxide layer is annealed in the presence of radical oxygen to modify a substantial portion of the plurality of bond defects by using oxygen atoms. The anneal, in one form, is an in-situ steam generation (ISSG) anneal. In one form, the insulating layer overlies a layer of charge storage material, such as nanoclusters, that form a gate structure of a semiconductor storage device. The ISSG anneal repairs bond defects by oxidizing defective silicon bonds in the oxide layer when the oxide layer is silicon dioxide.

9 Claims, 3 Drawing Sheets

OTHER PUBLICATIONS

Luo et al; "Effect of $H_2$ Content on Reliability of Ultrathin In-Situ Steam Generated (ISSG) $SiO_2$"; IEEE Electron Device Letters; vol. 21; No. 9; Sep. 2000.

Hori; "Thermally Grown Silicon Oxide"; *Gate Dielectrics and MOS ULSIs, Principles, Technologies, and Applications*; pp. 149-207; Springer-Vertage Berlin Heidelberg 1997.

Gusev, EP, et al., "Growth and Characterization of Ultrathin Nitrided Silicon Oxide Films" IBM J. Res. Develop. vol. 43, No. 3, May 1999, pp. 265-286.

Ma, TP, "Metal-oxide-semiconductor gate oxide reliability and the role of fluorine" J. Vac. Sci. Technol. A. 10(4), Jul./Aug. 1992, pp. 705-712.

* cited by examiner

US 7,767,588 B2

METHOD FOR FORMING A DEPOSITED OXIDE LAYER

BACKGROUND OF THE INVENTION

1. Field of the Invention

This invention relates in general to methods for forming oxide layers and more specifically to a method for forming a deposited oxide layer.

2. Description of the Related Art

Traditionally, deposited oxide layers are formed using processes, such as chemical vapor deposition. Deposited oxide layers suffer from several problems. In particular, such deposited oxide layers have many structural defects, including, for example, Si dangling bonds, weak Si—Si bonds, and strained Si—O bonds. These structural defects can cause problems in operation of devices having these deposited oxide layers because of undesirable phenomena, such as charge trapping in the oxide and trap-assisted tunneling of charges through the oxide. By way of example, in nanocluster devices these phenomena can cause a shift in the threshold voltage of these devices. Further, since the trapped charges in the deposited oxide layer are not electrically erased they tend to accumulate with repeated program and erase cycles.

Thus, there is a need for improved methods for forming a deposited oxide layer.

BRIEF DESCRIPTION OF THE DRAWINGS

The present invention may be better understood, and its numerous objects, features, and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, a method of forming a deposited insulating layer is provided. The method of forming the deposited insulating layer may include providing a substrate and depositing an oxide layer overlying the substrate. The oxide layer may have a plurality of bond defects. As used herein, the term "overlying" is not limited to directly overlying. The method may further include annealing the oxide layer in the presence of radical oxygen to modify a substantial portion of the plurality of bond defects by using oxygen atoms.

In another aspect, a method of forming a semiconductor structure is provided. The method may include forming a substrate and forming a first insulating layer over the substrate. The method may further include forming a charge storage layer overlying the first insulating layer. The method may further include forming a protective coating on exposed surfaces of the charge storage layer. The method may further include forming a second insulating layer overlying the charge storage layer where the second insulating layer has a plurality of bond defects. The method may further include annealing the second insulating layer in the presence of radical oxygen at a temperature in a range of eight hundred degrees Celsius to one thousand one hundred degrees Celsius to correct a substantial portion of the plurality of bond defects.

In yet another aspect, a method of forming a semiconductor structure includes providing a silicon substrate. The method may further include growing a first insulating layer from the silicon substrate and overlying the silicon substrate. The method may further include forming a layer of nanoclusters overlying the first insulating layer. The method may further include protecting the layer of nanoclusters with a coating that prevents oxidation of the nanoclusters. The method may further include forming a second insulating layer overlying the layer of nanoclusters by depositing the second insulating layer. The method may further include performing a first anneal to densify the second insulating layer. The method may further include performing a second anneal by annealing in a radical oxygen ambient, such that the second anneal may reduce a total number of bond defects present in the second insulating layer.

Figure 1:
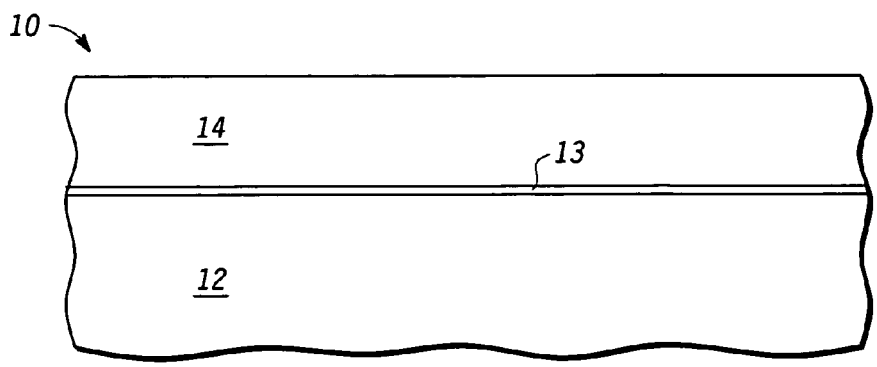
FIG. 1 is a partial side view of one embodiment of a semiconductor device during a processing stage, consistent with one embodiment of the invention.
Figure 2:
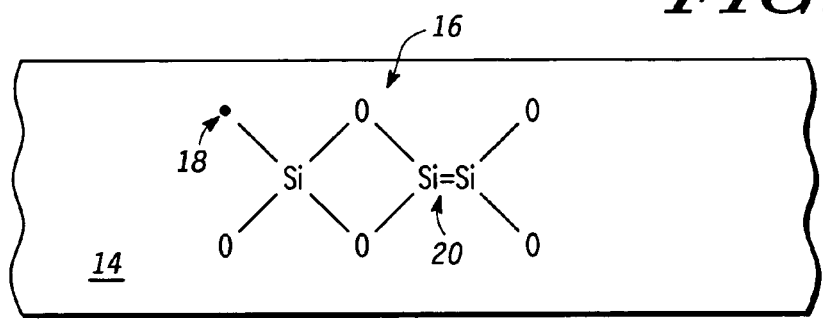
FIG. 2 is a drawing illustrating exemplary micro-structural defects in a deposited oxide layer, consistent with one embodiment of the invention.

FIG. 1 is a partial side view of one embodiment a semiconductor device during a processing stage, consistent with one embodiment of the invention. Semiconductor device 10 may include a substrate 12. A barrier layer 13 may be formed over substrate 12. Barrier layer 13 may be a nitride layer or any other suitable barrier layer or layers. Next, a deposited oxide layer 14, such as a $SiO_2$ layer may be formed over substrate 12 using chemical vapor deposition or plasma-enhanced chemical vapor deposition, for example. As shown in FIG. 2, deposited oxide layer 14 may have several micro-structural defects 16. Such micro-structural defects may include bond defects, such as silicon dangling bond 18 and weak silicon-silicon bond 20.

Figure 3:
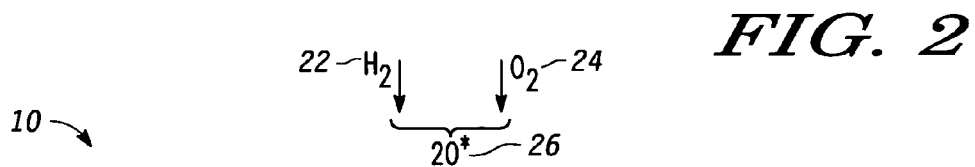
FIG. 3 is a partial side view of one embodiment of a semiconductor device during a processing stage, consistent with one embodiment of the invention.
Figure 3:
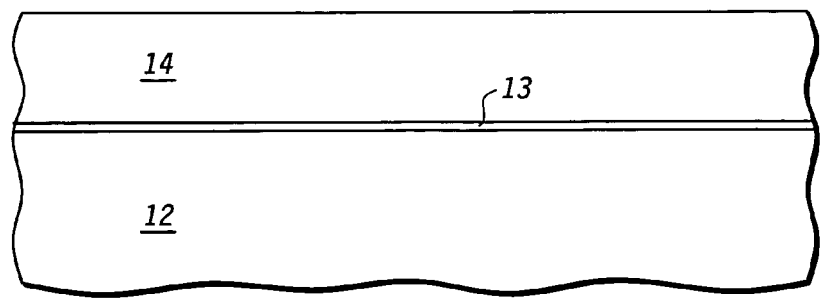
Figure 4:
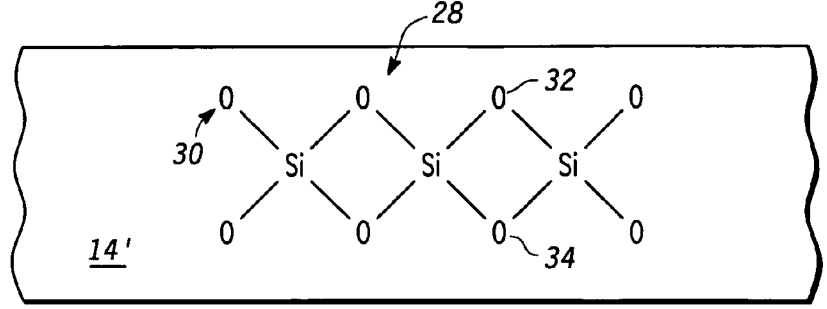
FIG. 4 is a drawing illustrating exemplary removal of micro-structural defects in a deposited oxide layer, consistent with one embodiment of the invention.

Referring now to FIG. 3, deposited oxide layer 14 may be annealed in the presence of oxygen radicals. By way of example, using techniques, such as in-situ steam generation (ISSG), deposited oxide layer 14 may be annealed in the presence of oxygen radicals. Thus, as shown in FIG. 3, hydrogen ($H_2$) 22 and oxygen ($O_2$) 24 may be introduced into a chamber containing semiconductor device 10 at a temperature ranging between 800-1100 degrees Celsius. Hydrogen 22 and oxygen 24 may react over deposited oxide layer 14 to form oxygen radicals (2O*) 26. By way of example, 1% of hydrogen may be combined with 99% of oxygen to form oxygen radicals (2O*) 26. In general, by way of example, 0.5% to 33% hydrogen may be used as part of the hydrogen and oxygen mixture. Oxygen radicals 26 may repair at least some of the micro-structural defects shown in FIG. 2. In particular, as shown with reference to FIG. 4, oxygen radicals 26 may form co-valent silicon-oxygen bonds 30, 32, and 34, for example. Thus, this process of annealing deposited oxide layer 14 in the presence of oxygen radicals 26 may result in a stoichiometric structure 28 in deposited oxide layer 14'. In particular, a substantial number of bond defects, such as silicon dangling bonds and weak silicon-silicon bonds may be repaired by using this process. Other techniques, such as plasma $O_2$ or ultra-violet $O_2$ anneal may also be used to generate the oxygen radicals. By way of example, either prior to performing the ISSG anneal or after performing the ISSG anneal, semiconductor device 10 may be subjected to an inert anneal. The inert anneal process may densify deposited oxide layer 14/14'. The inert anneal process may further lead to hydrogen desorption from deposited oxide layer 14/14'. The inert anneal process may be performed by subjecting semiconductor device 10 to an inert gas, such as nitrogen, argon, or helium in a chamber at a temperature in a range of 800 to 1200 degrees Celsius.

Figure 5:
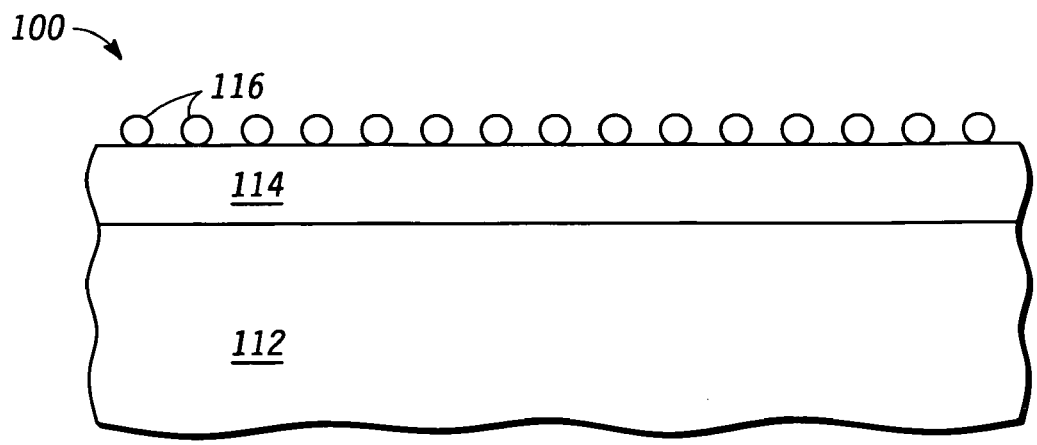
FIG. 5 is a partial side view of one embodiment of a nanocluster device during a processing stage, consistent with one embodiment of the invention.

FIG. 5 shows an exemplary nanocluster device 100 during a processing stage. Nanocluster device 100 may include a substrate 112, a thermally grown oxide layer 114, and nanoclusters 116 formed over thermally grown oxide layer 114. Thermally grown oxide layer 114 may act as an insulating layer. Nanocluster device 100 may be used as part of a non-volatile memory, for example as part of the gate structure. Nanoclusters 116 may act as a charge storage layer. Although FIG. 5 shows nanoclusters 116 acting as a charge storage layer, other structures, such as a nitride layer may be used as the charge storage layer.

Figure 6:
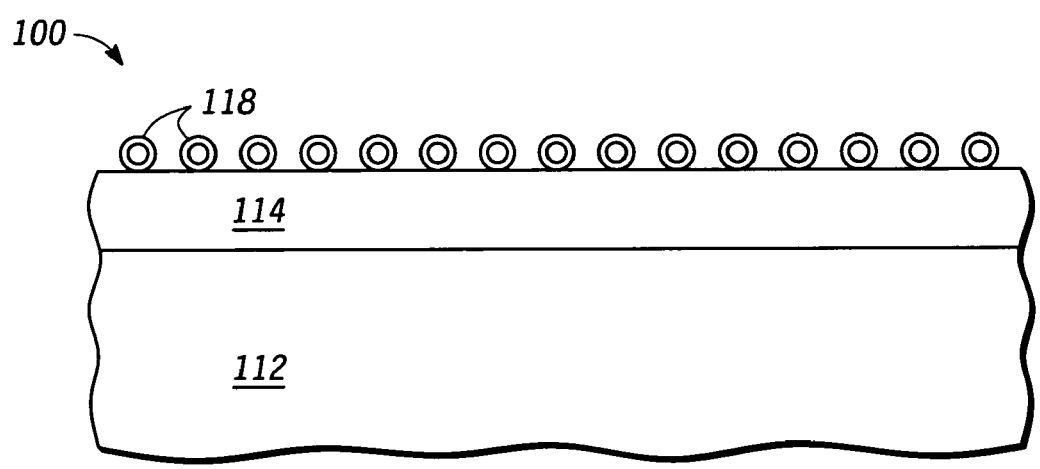
FIG. 6 is a partial side view of one embodiment of a nanocluster device during a processing stage, consistent with one embodiment of the invention.
Figure 7:
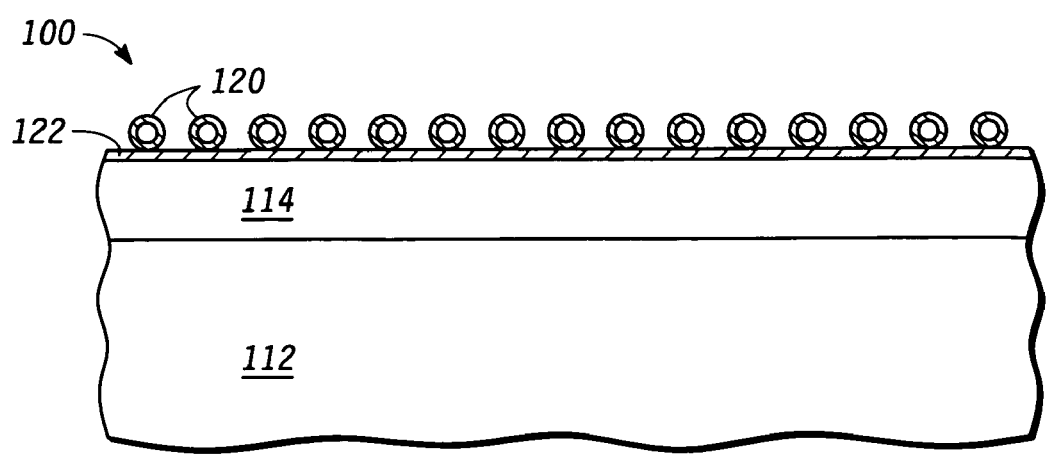
FIG. 7 is a partial side view of one embodiment of a nanocluster device during a processing stage, consistent with one embodiment of the invention.

Next, as shown in FIG. 6, passivated nanoclusters 118 may be formed by thermal oxidation in a nitrogen containing atmosphere, such as nitric oxide, nitrous oxide, or ammonia. Additionally and/or alternatively, passivated nanoclusters 118 may be subjected to nitridation, as shown in FIG. 7. Nitridation may result in nitrided nanoclusters 120 and a nitride layer 122 overlying thermally grown oxide layer 114. Nitridation could be performed using a plasma process.

Figure 8:
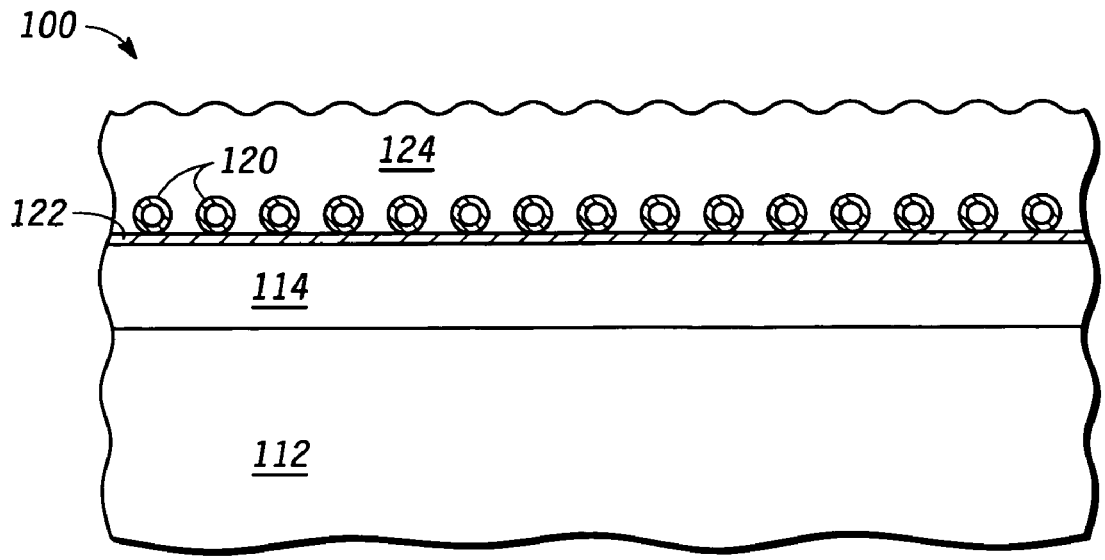
FIG. 8 is a partial side view of one embodiment of a nanocluster device during a processing stage, consistent with one embodiment of the invention.

Next, as shown in FIG. 8, a deposited oxide layer 124 may be formed over nitride layer 122 and nitrided nanoclusters 120. Deposited oxide layer 124, such as a $SiO_2$ layer may be formed using chemical vapor deposition or plasma-enhanced chemical vapor deposition, for example. Although FIG. 8 shows nitrided nanoclusters 120, the nanoclusters need not be nitrided.

Figure 9:
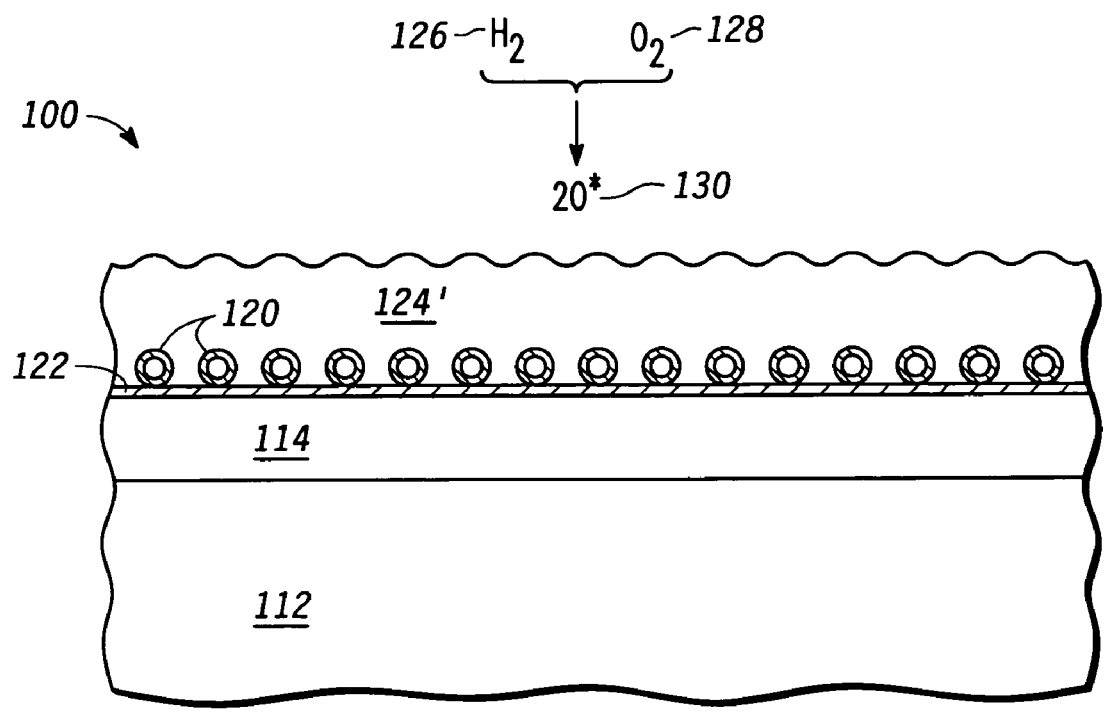
FIG. 9 is a partial side view of one embodiment of a nanocluster device during a processing stage, consistent with one embodiment of the invention.

Referring now to FIG. 9, deposited oxide layer 124 may be annealed in the presence of oxygen radicals. By way of example, using techniques, such as in-situ steam generation (ISSG), deposited oxide layer 124 may be annealed in the presence of oxygen radicals. By way of example, hydrogen ($H_2$) 126 and oxygen ($O_2$) 128 may be introduced into a chamber containing semiconductor device 100 at a temperature ranging between 800-1100 degrees Celsius. Hydrogen 126 and oxygen 128 may react over deposited oxide layer 124 to form oxygen radicals (2O*) 130. By way of example, 1% of hydrogen may be combined with 99% of oxygen to form oxygen radicals (2O*) 130. In general, by way of example, 0.5% to 33% hydrogen may be used as part of the hydrogen and oxygen mixture. Oxygen radicals 130 may repair at least some of the micro-structural defects, for example, as shown above with reference to FIG. 2. In particular, as shown above with reference to FIG. 4, oxygen radicals 130 may form co-valent silicon-oxygen bonds, for example. Thus, this process of annealing deposited oxide layer 124 in the presence of oxygen radicals 130 may result in a deposited oxide layer 124' having a stoichiometric structure. In particular, a substantial number of bond defects, such as silicon dangling bonds and weak silicon-silicon bonds may be repaired by using this process. Other techniques, such as plasma $O_2$ or ultra-violet $O_2$ anneal may also be used to generate the oxygen radicals. By way of example, either prior to performing the ISSG anneal or after performing the ISSG anneal, semiconductor device 100 may be subjected to an inert anneal. The inert anneal process may densify deposited oxide layer 124/124'. The inert anneal process may further lead to hydrogen desorption from deposited oxide layer 124/124'. The inert anneal process may be performed by subjecting semiconductor device 100 to an inert gas, such as nitrogen, argon, or helium in a chamber at a temperature in a range of 800 to 1200 degrees Celsius.

Repair of deposited oxide layer 124 may result in removal of a substantial number of bond defects from deposited oxide layer 124. This may result in reduction in charge trapping in the oxide and associated threshold voltage shifts during program/erase operation of the nanocluster device, such as a non-volatile memory device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a deposited insulating layer, comprising:
    providing a substrate;
    depositing an oxide layer overlying the substrate, the oxide layer having a plurality of bond defects;
    annealing the oxide layer in the presence of radical oxygen to modify a substantial portion of the plurality of bond defects by using oxygen atoms; and
    forming a charge storage layer overlying the substrate, passivating the charge storage layer and covering the passivated charge storage layer with a nitride prior to depositing the oxide layer and annealing the oxide layer, the nitride constituting a barrier layer between the substrate and the oxide layer for protecting the substrate during the annealing of the oxide layer.

2. The method of claim 1, wherein annealing the oxide layer further comprises:
annealing the oxide layer by an in-situ steam generation (ISSG) anneal.

3. The method of claim 1 further comprising:
annealing the oxide layer at a temperature in a range of eight hundred degrees Celsius to one thousand one hundred degrees Celsius.

4. The method of claim 1, further comprising:
forming the charge storage layer by depositing a layer of nanoclusters.

5. The method of claim 1 further comprising:
performing an additional anneal which is an inert anneal at a temperature within a range of approximately eight hundred degrees Celsius to twelve hundred degrees Celsius subsequent to depositing the oxide layer.

6. A method of forming a semiconductor structure comprising:
providing a silicon substrate;
growing a first insulating layer from the silicon substrate and overlying the silicon substrate;
forming a layer of nanoclusters overlying the first insulating layer;
protecting the layer of nanoclusters by passivating the nanoclusters in an oxidizing ambient to form a coating and nitriding the coating to form a nitride layer overlying the layer of nanoclusters and exposed portions of the first insulating layer, the nitrided coating preventing oxidation of the nanoclusters;
forming a second insulating layer overlying the layer of nanoclusters by depositing the second insulating layer;
performing a first inert anneal to densify the second insulating layer; and
performing a second anneal by annealing in a radical oxygen ambient, the second anneal reducing a total number of bond defects present in the second insulating layer.

7. The method of claim 6 further comprising:
performing the second anneal as an in-situ steam generation anneal.

8. The method of claim 6 further comprising:
forming the second insulating layer as a silicon dioxide layer.

9. The method of claim 6 further comprising:
performing the second anneal prior to the inert first anneal.

* * * * *